(12) United States Patent
Nakamura

(10) Patent No.: US 8,004,808 B2
(45) Date of Patent: Aug. 23, 2011

(54) CONTROL APPARATUS

(75) Inventor: Nobuhiro Nakamura, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 526 days.

(21) Appl. No.: 12/294,183

(22) PCT Filed: Mar. 27, 2007

(86) PCT No.: PCT/JP2007/056300
§ 371 (c)(1),
(2), (4) Date: Sep. 23, 2008

(87) PCT Pub. No.: WO2007/116707
PCT Pub. Date: Oct. 18, 2007

(65) Prior Publication Data
US 2009/0103336 A1    Apr. 23, 2009

(30) Foreign Application Priority Data
Mar. 29, 2006   (JP) .................................. 2006-091580

(51) Int. Cl.
H02H 3/08 (2006.01)
(52) U.S. Cl. ..................... 361/93.2; 361/93.7; 361/93.9
(58) Field of Classification Search ................. 361/93.2, 361/93.7, 93.9
See application file for complete search history.

(56) References Cited

U.S. PATENT DOCUMENTS
5,715,129 A * 2/1998 Innes ........................ 361/93.2

FOREIGN PATENT DOCUMENTS

| JP | H01-129170 A | 5/1989 |
|---|---|---|
| JP | 03-022867 A | 1/1991 |
| JP | H03-022821 A | 1/1991 |
| JP | 04-308476 A | 10/1992 |
| JP | H07-308020 A | 11/1995 |
| JP | H08-079963 A | 3/1996 |
| JP | H10-193959 A | 7/1998 |
| JP | 2004-077078 A | 3/2004 |
| JP | 2004-205118 A | 7/2004 |
| JP | 2005-321203 A | 11/2005 |
| KR | 1993-0009900 A | 6/1993 |

OTHER PUBLICATIONS

Notice of Allowance of corresponding Korean Application No. 10-2008-7024941 dated Jul. 23, 2010.

* cited by examiner

Primary Examiner — Shawn Riley
(74) Attorney, Agent, or Firm — Global IP Counselors

(57) ABSTRACT

The present invention provides a control apparatus for detecting an early stage short circuit between the terminals of an electrolytic capacitor, and detecting a short circuit between a load that is connected in parallel to the electrolytic capacitor, the apparatus performing appropriate processing before an adverse effect is inflicted on peripheral equipment. In the control apparatus, microcomputers switch on a second relay; an electrolytic capacitor is gradually charged via a current-limiting resistor; a first voltage detection control for detecting a voltage between terminals of the electrolytic capacitor is performed when a first set time period has elapsed after the second relay has been switched on; and a second voltage detection control for detecting a voltage between the terminals of the electrolytic capacitor is performed when a second set time period, which is longer than the first set time period, has elapsed after the second relay has been switched on.

7 Claims, 5 Drawing Sheets

CONTROL APPARATUS

CROSS-REFERENCE TO RELATED APPLICATIONS

This U.S. National stage application claims priority under 35 U.S.C. §119(a) to Japanese Patent Application No. 2006-091580 respectively filed in Japan on Mar. 29, 2006, the entire contents of which are hereby incorporated herein by reference.

TECHNICAL FIELD

The present invention relates to a control apparatus provided with a converter for converting AC current output into DC current.

BACKGROUND ART

Circuits referred to as converters are conventionally used in many control apparatuses. The converter has a current-limiting circuit composed of a current-limiting resistor, a rectification circuit composed of a diode, and a smoothing circuit composed of a reactance and an electrolytic capacitor. The converter has a function for converting AC current output to DC current. The electrolytic capacitor disposed in the converter is a crucial component for supplying stable DC voltage to an inverter. There is a high probability of damaging the current-limiting resistor and a power transistor of the inverter in terms of a secondary failure if a short-circuit fault occurs in an electrolytic capacitor and in a load that is connected in parallel to the electrolytic capacitor. In order to prevent this type of failure, control apparatuses are widely used that detect a voltage between the terminals of an electrolytic capacitor and diagnose a failure (e.g., see Japanese Laid-open Patent Publication No. 3-22821).

SUMMARY OF THE INVENTION

Problem to be Solved by the Invention

However, no consideration is given in conventional control apparatuses to preferentially attempting to diagnose abnormalities in peripheral equipment even when a voltage abnormality occurring between the terminals of the electrolytic capacitor could prove lethal to the peripheral equipment, and it is possible that a thermal adverse effect would already be inflicted on peripheral equipment before the diagnosis of an abnormality is completed in relation to an abnormality that requires early detection, such as a short circuit between the terminals of an electrolytic capacitor.

In view of the foregoing problems, an object of the present invention is to provide a control apparatus for detecting at an early stage a short circuit between the terminals of an electrolytic capacitor, and a short circuit between a load that is connected in parallel to the electrolytic capacitor, and performing appropriate processing before an adverse effect is inflicted on peripheral equipment.

Means Used to Solve the Above-Mentioned Problems

The control apparatus according to a first aspect of the present invention has a converter, a current-limiting circuit, voltage detection means, and microcomputers. The converter converts output of an AC power source to a DC current. The current-limiting circuit is disposed in front of a rectification circuit of the converter and is composed of a relay and a current-limiting resistor. The voltage detection means detects voltage between the terminals of an electrolytic capacitor that is disposed in a smoothing circuit inside the converter. The microcomputers switch on the relay in a time period that lasts until a prescribed charging time elapses, and gradually charge the electrolytic capacitor via the current-limiting resistor. After the charging time has elapsed, a second voltage detection control for detecting the voltage between the terminals of the electrolytic capacitor is performed. The microcomputers also perform a first voltage detection control. The first voltage detection control is control for detecting voltage between the terminals of the electrolytic capacitor when a first time period, which is shorter than the charging time, has elapsed after the relay has been switched on.

In the control apparatus, if a short circuit occurs between the terminals of the electrolytic capacitor, the voltage between the terminals of the electrolytic capacitor after the first time period has elapsed does not reach a reference value. Accordingly, a short circuit between the terminals of the electrolytic capacitor is detected at an early stage, and appropriate processing is performed before an adverse effect is inflicted on peripheral equipment.

The control apparatus according to a second aspect of the present invention is the control apparatus according to the first aspect of the present invention wherein the relay is switched off without waiting for the charging time to elapse when the voltage between the terminals of the electrolytic capacitor detected by the first voltage detection control does not reach a prescribed reference value.

Here, charging is halted when a short circuit has occurred between the terminals of an electrolytic capacitor, and therefore the time period in which an overvoltage is applied to a current-limiting resistor is reduced. Accordingly, an abnormal release of heat from the current-limiting resistor caused by the overvoltage can be avoided.

The control apparatus according to a third aspect of the present invention is the control apparatus according to the second aspect of the present invention wherein an abnormality is determined and a retrial control is performed for performing the first voltage detection control again when the voltage between the terminals of the electrolytic capacitor detected by the first voltage detection control does not reach a prescribed reference value.

Here, it is confirmed whether or not the previous abnormality determination is a chance occurrence or not by performing a retrial of the first voltage detection control once again. Accordingly, the reliability of abnormality determination is enhanced.

The control apparatus according to a fourth aspect of the present invention is the control apparatus according to the third aspect of the present invention wherein the number of times an abnormality has been determined is counted when the voltage between the terminals of the electrolytic capacitor has been determined to be abnormal in the first voltage detection control. A failure that causes an abnormality in the voltage between the terminals of the electrolytic capacitor is determined to have occurred when the number of abnormality determinations has reached a prescribed numerical value.

Here, erroneous determinations due to noise can be avoided, and the reliability of confirming an abnormality is therefore increased.

The control apparatus according to a fifth aspect of the present invention is the control apparatus according to the fourth aspect of the present invention wherein the retrial control is not performed when a failure that causes the abnormality of the voltage between the terminals of the electrolytic capacitor is determined to have occurred.

Here, there is no unnecessary repetition of the retrial control, and wasted current to the current-limiting resistor is suppressed. Accordingly, the impact of heat on peripheral equipment from a temperature increase of the current-limiting resistor is alleviated.

The control apparatus according to a sixth aspect of the present invention is the control apparatus according to the fourth aspect of the present invention wherein a remote control unit is further provided. An abnormality warning is displayed when a failure that causes the abnormality of the voltage between the terminals of the electrolytic capacitor is determined to have occurred. The retrial control is not performed until operation is performed by the remote control unit.

Here, operation is not performed until the cause of the abnormality between the terminals of the electrolytic capacitor is resolved, and product safety is therefore enhanced.

The control apparatus according to a seventh aspect of the present invention is the control apparatus according to the first aspect of the present invention wherein, in a case in which the voltage between the terminals of the electrolytic capacitor detected by the first voltage detection control reaches a prescribed reference value, a second voltage detection control for detecting the voltage between the terminals of the electrolytic capacitor is performed when the charging time has elapsed.

Here, an abnormality between the terminals of the electrolytic capacitor that is not detected by the first voltage detection control is detected by the second voltage detection control. Accordingly, the reliability of the operation for detecting an abnormality between terminals of the electrolytic capacitor is enhanced.

EFFECT OF THE INVENTION

In the control apparatus according to a first aspect of the present invention, a short circuit between the terminals of the electrolytic capacitor is detected at an early stage, and therefore appropriate processing is performed before an adverse effect is inflicted on peripheral equipment.

In the control apparatus according to a second aspect of the present invention, the time period in which an overvoltage is applied to a current-limiting resistor is reduced and an abnormal release of heat from the current-limiting resistor caused by the overvoltage can be avoided.

In the control apparatus according to a third aspect of the present invention, it is confirmed whether or not the previous abnormality determination is a chance occurrence by performing the retrial control of the first voltage detection control, and the reliability of abnormality determination is therefore enhanced.

In the control apparatus according to a fourth aspect of the present invention, erroneous determinations due to noise are avoided, and the reliability of confirming an abnormality is therefore increased.

In the control apparatus according to a fifth aspect of the present invention, there is no unnecessary repetition of the retrial control, and wasted current to the current-limiting resistor is suppressed. Accordingly, the impact of heat on peripheral equipment from a temperature increase of the current-limiting resistor is alleviated.

In the control apparatus according to a sixth aspect of the present invention, operation is not performed until the cause of the abnormality between the terminals of the electrolytic capacitor is resolved, and product safety is therefore enhanced.

In the control apparatus according to a seventh aspect of the present invention, an abnormality between the terminals of the electrolytic capacitor that is not detected by the first voltage detection control is detected by the second voltage detection control. Therefore, the reliability of the operation for detecting an abnormality between terminals of the electrolytic capacitor is enhanced.

DETAILED DESCRIPTION OF THE INVENTION

<Configuration of the Air Conditioning Unit>

Figure 1:
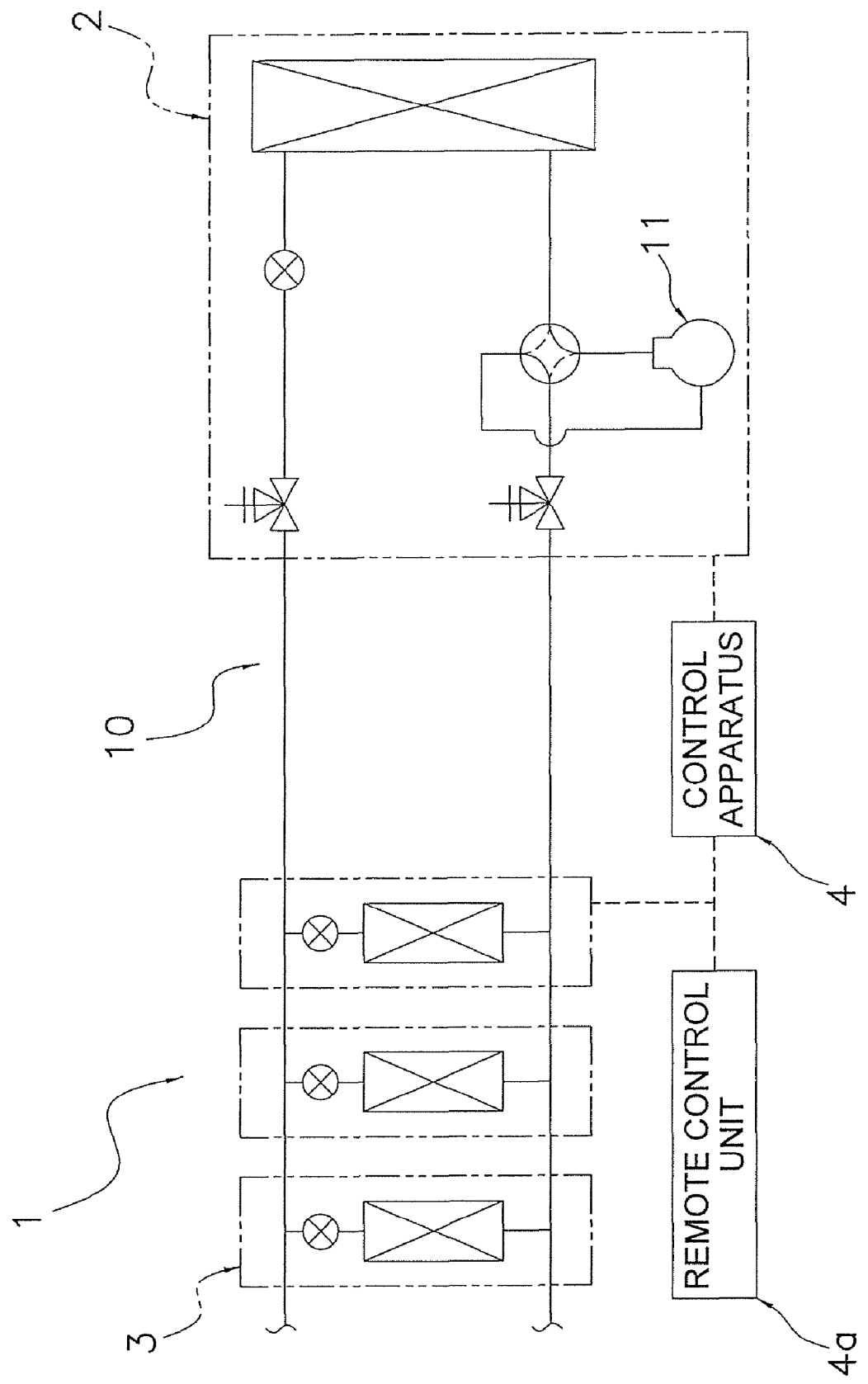
FIG. 1 is a configuration diagram of an air conditioning unit.

A configuration diagram of an air conditioning unit is shown in FIG. 1. The air conditioning unit 1 is a multiple-type air conditioning unit for use in an office building. In the air conditioning unit, a plurality of indoor units 3 is connected in parallel to one or a plurality of outdoor units 2, and a refrigerant circuit 10 is formed so that refrigerant can flow. A control apparatus 4 controls a compressor 11 and a variety of other constituent apparatuses so that the air conditioning unit 1 runs with good efficiency. A remote control unit 4a sends and receives signals between the control apparatus 4 to start and stop the compressor 11 by manual operation.

In any cases, compressor 11 involves the combined use of a variable-capacity inverter compressor for controlling rotational speed by using an inverter, and a constant-capacity compressor in which constant capacity is implemented by on-off control.

<Control Apparatus of Air Conditioning Unit>

Figure 2:
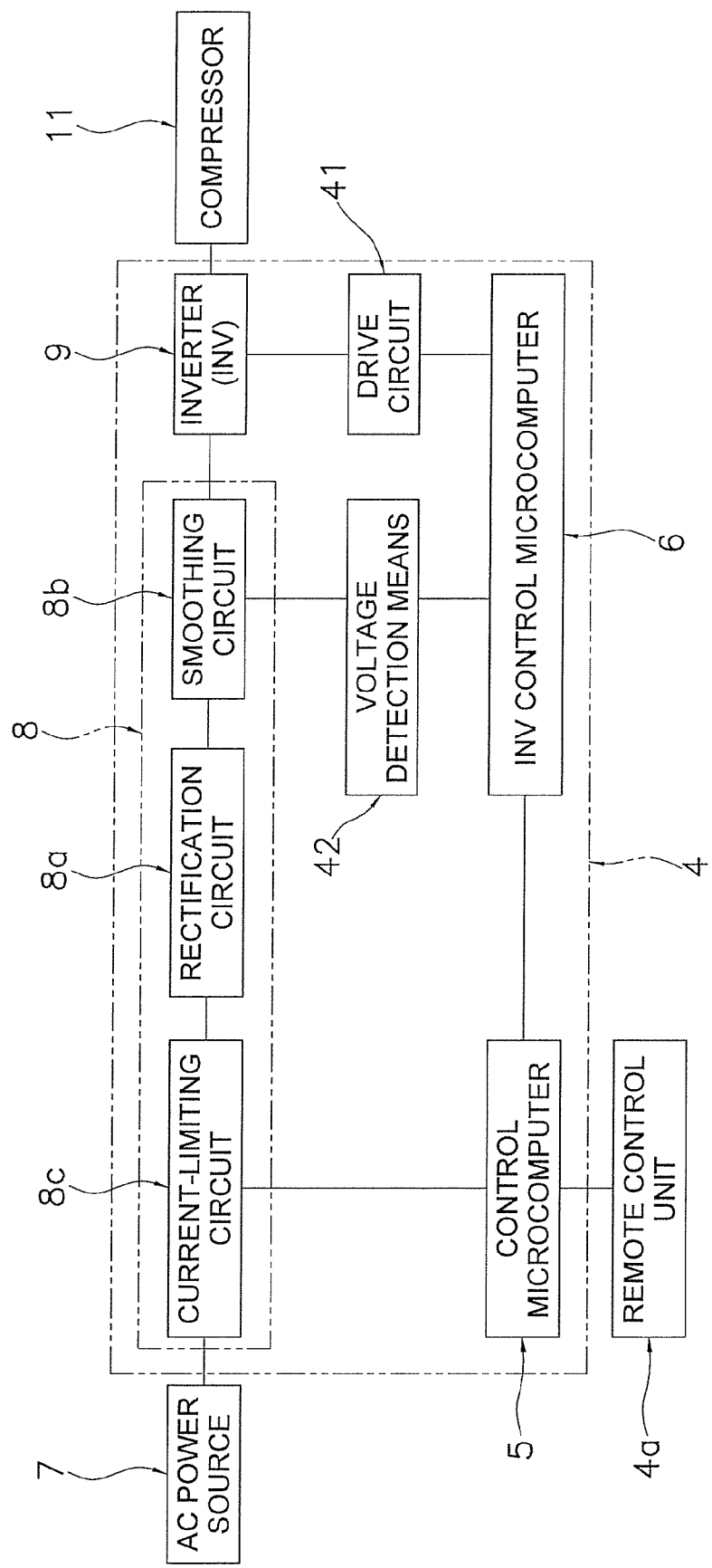
FIG. 2 is a block diagram of the control apparatus according to an embodiment of the present invention.
Figure 3:
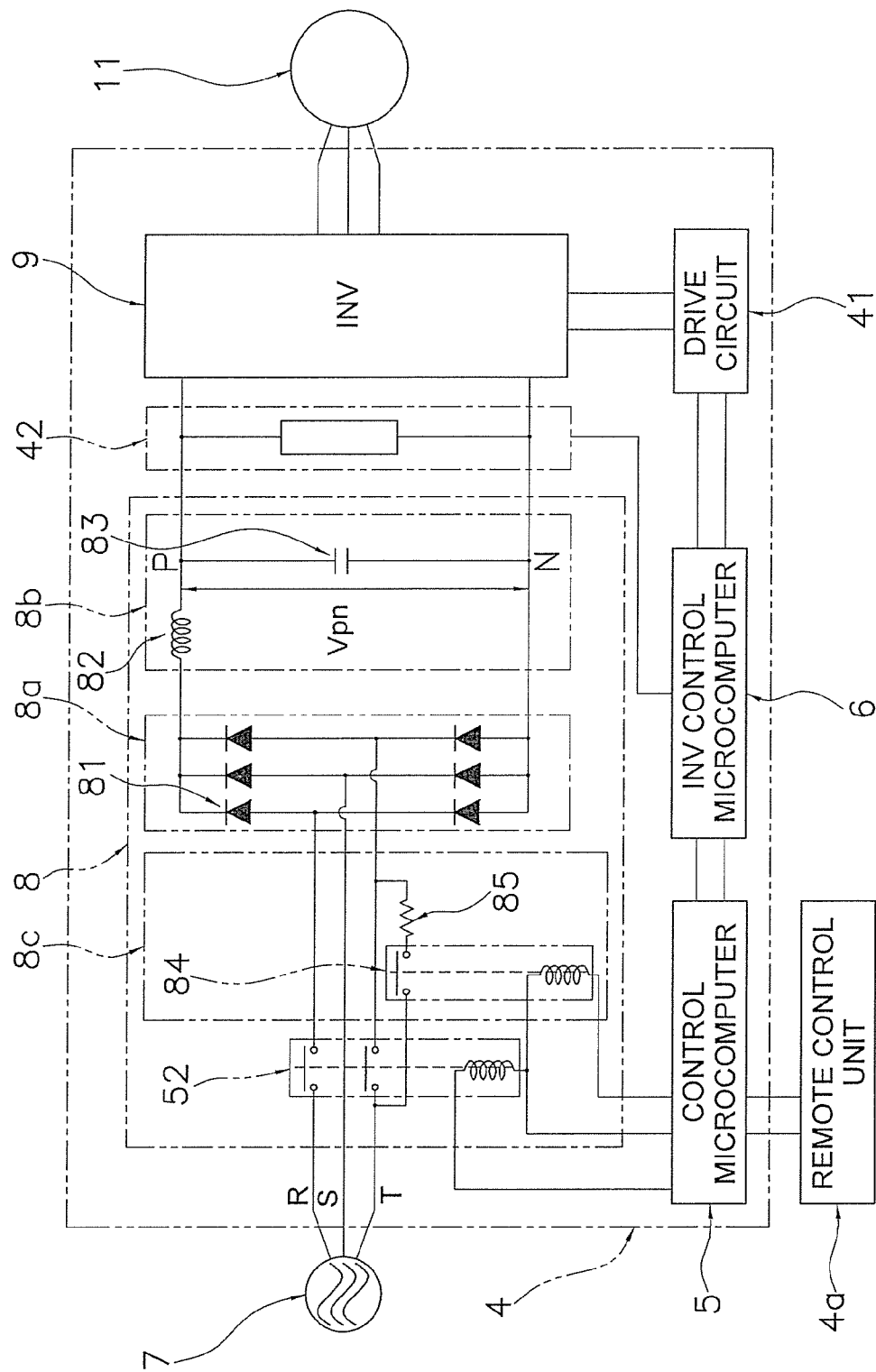
FIG. 3 is an electric circuit diagram of the control apparatus.

FIG. 2 is a block diagram of the control apparatus according to an embodiment of the present invention, and FIG. 3 is an electric circuit diagram of the control apparatus. In FIG. 2, the control apparatus 4 includes a control microcomputer 5 and an inverter control microcomputer (hereinafter referred to as INV control microcomputer) 6. The control microcomputer 5 operates a first relay 52 (see FIG. 3), described hereinafter and a second relay 84 (see FIG. 3), and protects an electrolytic capacitor 83 (see FIG. 3) of a converter 8. The INV control microcomputer 6 controls an inverter 9 via a drive circuit 41.

In FIG. 3, in the control apparatus 4, an R phase, an S phase, and a T phase of an AC current source 7 are connected to the converter 8 in order to convert the power source from AC current to DC current. The R phase and the T phase are connected to the converter 8 via the first relay 52. A current-limiting circuit 8c composed of the second relay 84 and a current-limiting resistor 85 is connected in parallel to the first relay 52 of the T phase.

The converter 8 has a rectification circuit 8a composed of six diodes 81, and a smoothing circuit 8b composed of a reactance 82 and an electrolytic capacitor 83. The inverter 9 converts the DC current output from the converter 8 to AC current having an arbitrary frequency, and supplies the AC current to a motor of the compressor 11. The inverter 9 is driven by a drive circuit 41, and the drive circuit 41 is controlled by the INV control microcomputer 6. The INV control microcomputer 6 detects voltage $V_{pn}$ between the terminals of the electrolytic capacitor 83 via voltage detection means 42.

<Temperature Increase Suppression Control of Current-limiting Resistor>

When the power source is switched on, the second relay 84 is switched on prior to the first relay 52, and the electrolytic capacitor 83 is gradually charged by way of the current-limiting resistor 85. Supposing a case in which the first relay 52 is switched on when the electrolytic capacitor 83 is either in an uncharged or an insufficiently charged state, an inrush voltage is applied to the electrolytic capacitor 83, and there is a possibility that the electrolytic capacitor 83 will be damaged. Accordingly, the first relay 52 is switched on after the electrolytic capacitor 83 is reasonably charged. The charging time will vary according to the model of the air conditioning unit 1, but requires four seconds in the present embodiment.

There is a possibility that peripheral equipment will be damaged if a short circuit occurs between PN terminals in FIG. 3, i.e., a short circuit occurs between the terminals of the electrolytic capacitor 83, a power source voltage of 200 V is applied to the two terminals of the current-limiting resistor 85 during charging, and the current-limiting resistor 85 abnormally releases heat. A temperature increase suppression logic is set in the control apparatus 4 in order to detect at an early stage a short circuit between PN terminals (between the terminals of the electrolytic capacitor 83) and prevent in advance an abnormal release of heat by the current-limiting resistor 85. The temperature increase suppression logic of the current-limiting resistor 85 will be described hereinafter with reference to the accompanying diagrams.

<Temperature Increase Suppression Control Logic of Current-limiting Resistor>

Figure 4:
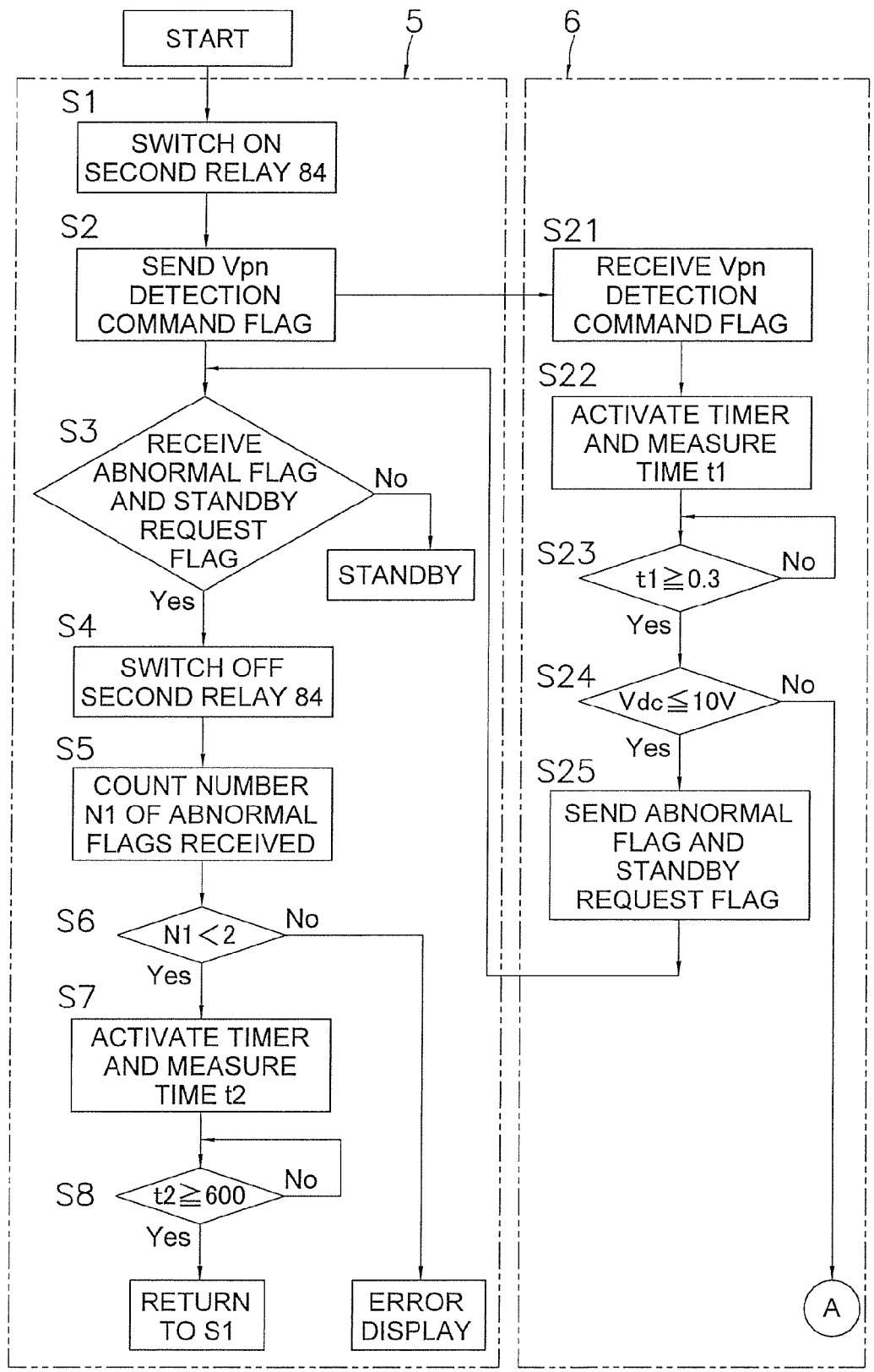
FIG. 4 is a flowchart of a temperature increase suppression control of a current-limiting resistor.

FIG. 4 is a flowchart of a temperature increase suppression control of the current-limiting resistor 85. In FIG. 4, when the power source is switched on, a control microcomputer 5 switches on a second relay 84 (S1) and sends a command flag signal for detecting $V_{pn}$ to an INV control microcomputer 6 (S2). The INV control microcomputer 6 receives a $V_{pn}$ detection flag (S21) and causes a timer to operate, and the timer times the time t1 which has elapsed after the second relay 84 has been switched on (S22). Next, the INV control microcomputer 6 determines whether or not t1 has reached 0.3 seconds (S23), and if Yes, the microcomputer determines whether or not $V_{pn}$ is 10 V or less (S24). If S24 is Yes, there is a possibility that a short circuit exists between the terminals of the electrolytic capacitor 83, and an abnormal flag and a standby request flag are therefore sent to the control microcomputer 5 (S25). If S24 is No, the routine proceeds to A. The flow from S21 through S25 is referred to as a first voltage detection control.

The control microcomputer 5 receives the abnormal flag and the standby request flag sent from the INV control microcomputer 6 (S3), and switches off the second relay 84 (S4). The control microcomputer begins counting the number N1 of abnormal flag signals received (S5). The control microcomputer determines whether or not N1 is less than 2 (S6), and if Yes, a timer is activated to time t2 (S7). The control microcomputer determines whether or not t2 has reached 600 seconds (S8), and if Yes, the routine returns to S1. If the determination of S6 is No, then the control microcomputer 5 determines that there is a failure in which a voltage abnormality has occurred between the terminals of the electrolytic capacitor 83, and displays an abnormality warning. The flow from S3 through S8 is referred to as retrial control.

As described above, the microcomputers 5, 6 of the control apparatus 4 switch on the second relay 84, and, provided that $V_{pn}$ after 0.3 seconds is 10 V or less, switches on the second relay 84 again 600 seconds thereafter, and detects the $V_{pn}$ after 0.3 seconds. If the $V_{pn}$ detected a second time remains at 10 V or less, then a short circuit is determined to have occurred between PN terminals (between the terminals of the electrolytic capacitor 83), operation is halted, and an abnormality warning is displayed. When the abnormality warning is displayed, the retrial control will not be operated again without manual reset (remote control reset) by way of the remote control unit 4a. In this way, temperature increase of the current-limiting resistor 85 is controlled.

<Undervoltage Detection Control>

When the control apparatus 4 determines that there is no abnormality between the PN terminals, the electrolytic capacitor 83 continues to charge. When the electrolytic capacitor 83 has been normally charged, the control apparatus 4 can switch on the first relay 52 and start the motor of the compressor 11. However, when the electrolytic capacitor 83 has not been normally charged, an inrush voltage is applied to the electrolytic capacitor 83 when the first relay 52 is switched on, and when this inrush voltage is applied repeatedly, there is a possibility that the electrolytic capacitor 83 will be damaged. Accordingly, the control apparatus 4 must detect the voltage $V_{pn}$ between the terminals of the electrolytic capacitor 83 and determine whether voltage is insufficient before the first relay 52 is switched on. An undervoltage detection control logic for the electrolytic capacitor 83 is set in the control apparatus 4.

<Undervoltage Detection Control Logic>

Figure 5:
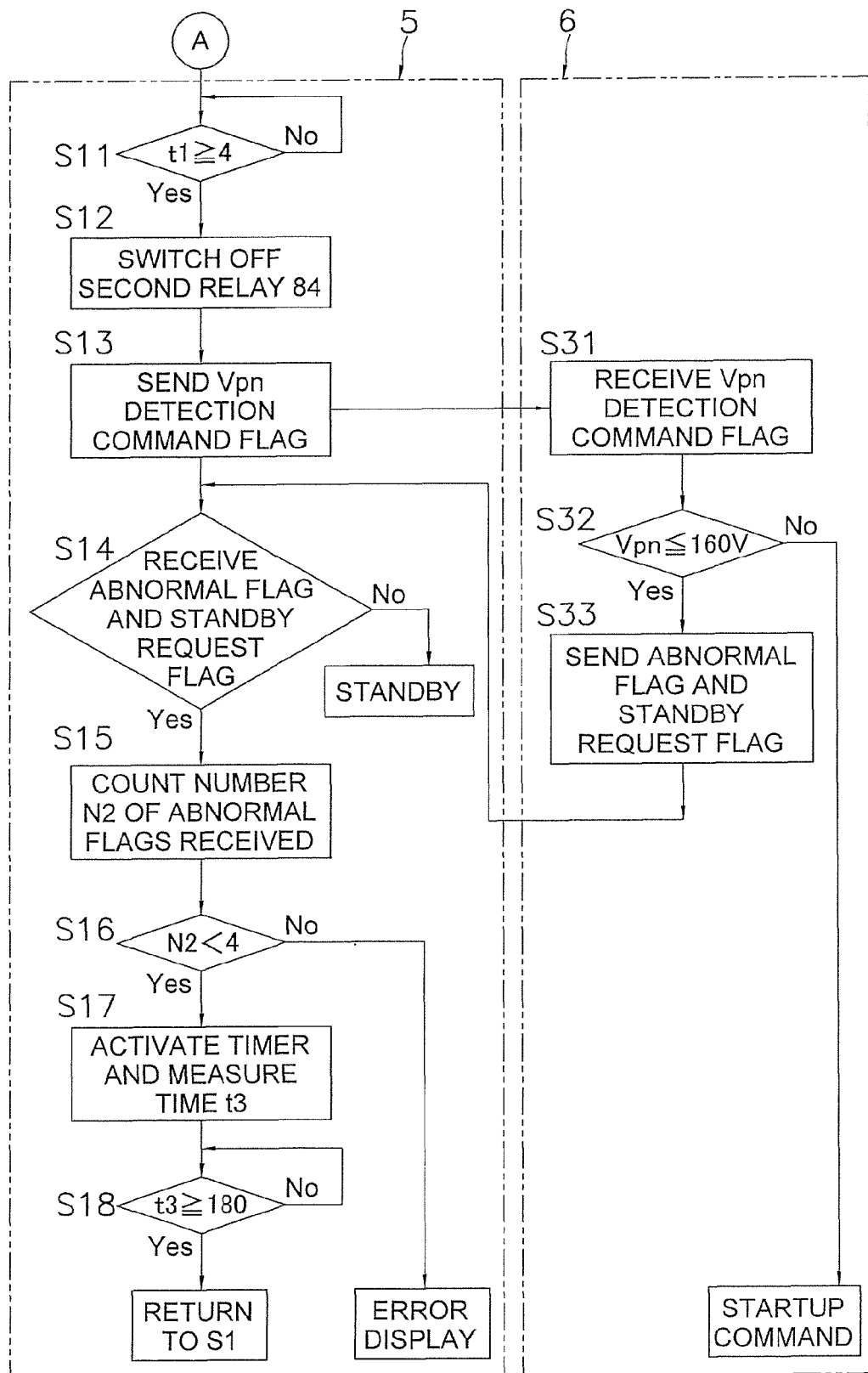
FIG. 5 is a flowchart of an undervoltage detection control of an electrolytic capacitor.

FIG. 5 is a flowchart of undervoltage detection control of an electrolytic capacitor 83. When it is determined that $V_{pn}$ has surpassed 10 V in the temperature increase suppression control S24 of the current-limiting resistor 85, the microcomputer 5 takes over from microcomputer 6 the timing of the time t1 that has elapsed since the second relay 84 was switched on, and determines whether or not t1 has reached 4 seconds (S11). If S11 is Yes, the second relay 84 is switched off (S12), and a command flag signal for detecting $V_{pn}$ is sent to an INV control microcomputer 6 (S13). The INV control microcomputer 6 receives a command flag signal for detecting $V_{pn}$ (S31) and determines whether or not $V_{pn}$ is 160 V or less (S32). If S32 is Yes, an abnormal flag and a standby request flag are sent to the control microcomputer 5 (S33). If S32 is No, conditions are determined to be normal, and the first relay 52 is switched on in order to start the compressor 11. Here, the flow from S11 through S13 and from S31 through S33 is referred to as second voltage detection control.

The control microcomputer 5 receives the abnormal flag and the standby request flag sent from the INV control microcomputer 6 (S14), and begins counting the number N2 of abnormal flag signals received (S15). A determination is made as to whether or not N2 is less than 4 (S16), and if Yes, a timer is activated to time t3 (S17). A determination is made as to whether or not t3 has reached 180 seconds or more (S18), and if Yes, the routine returns to S1. The reason for placing a 180-second waiting period in S18 is to ensure a sufficient discharge of the charge inside the electrolytic capacitor 83. If the determination of the above-described S16 is No, an abnormality warning is displayed. The flow from S13 through S18 is referred to as retrial control.

The microcomputers 5 and 6 of the control apparatus 4 switch on the second relay 84, switch off the second relay 84 four seconds thereafter, and detect the $V_{pn}$, as described above. If the $V_{pn}$ is 160 V or less, an abnormality is determined, and 180 seconds later the second relay 84 is again switched on. In the case in which an abnormality is determined four times consecutively, a failure of the electrolytic capacitor 83 is determined, operation is halted, and an abnormality warning is displayed. When the abnormality warning is displayed, the retrial control will not be restarted without manual reset (remote control reset) by way of the remote control unit 4a. A failure of the electrolytic capacitor 83 is determined in this way and appropriate measures can be taken.

<Characteristics>

(1)

In the control apparatus 4, the control microcomputer 5 switches on a second relay 84 during a period that lasts until a prescribed charging time (4 seconds) elapses, and gradually charges the electrolytic capacitor 83 via the current-limiting resistor 85. When the charging time has expired, the second voltage detection control is carried out for detecting the voltage between the terminals of the electrolytic capacitor 83. The control microcomputer 5 and the INV control microcomputer 6 also carry out the first voltage detection control. The first voltage detection control is control for detecting voltage between the terminals of the electrolytic capacitor 83 when a first time period (0.3 seconds), which is shorter than the charging time, has elapsed after the second relay 84 has been switched on. When a short circuit occurs between the terminals of the electrolytic capacitor 83, the voltage between the terminals of the electrolytic capacitor 83 after the first time period has elapsed does not reach the reference value, and the short circuit between the terminals of the electrolytic capacitor 83 is therefore detected at an early stage by way of the first voltage detection control. Accordingly, appropriate processing is performed before an adverse effect is inflicted on peripheral equipment. When the voltage between the terminals of the electrolytic capacitor 83 that is detected by the first voltage detection control does not reach a prescribed reference value, the second relay 84 is switched off without waiting for the expiration of the charging time, and the time period in which an overvoltage is applied to a current-limiting resistor 85 can therefore be reduced and an abnormal release of heat from the current-limiting resistor 85 caused by the overvoltage can be avoided. In a case in which the voltage between the terminals of the electrolytic capacitor detected by the first voltage detection control reaches the prescribed reference value, the second voltage detection control for detecting the voltage between the terminals of the electrolytic capacitor 83 is carried out when the charging time has ended. Accordingly, an abnormality between the terminals of the electrolytic capacitor that is not detected by the first voltage detection control is detected by the second voltage detection control, and the reliability of the operation for detecting an abnormality between the terminals of the electrolytic capacitor is enhanced.

(2)

In the control apparatus 4, when the voltage between the terminals of the electrolytic capacitor 83 that is detected by the first voltage detection control does not reach a prescribed reference value (exceeding 10 V), the control apparatus 4 determines that an abnormality has occurred and a retrial control is performed for carrying out the first voltage detection control again. When the voltage between the terminals of the electrolytic capacitor 83 detected by the first voltage detection control is not normal, the second voltage detection control is not performed. Accordingly, wasted current to the current-limiting resistor 85 is suppressed, and the impact of heat on peripheral equipment from a temperature increase of the current-limiting resistor 85 is alleviated. In a case in which an abnormality is determined through the first voltage detection control, counting of the number of abnormal signals begins, and when the number of abnormal signals reaches a prescribed value, a failure that causes a voltage abnormality between the terminals of the electrolytic capacitor 83 is determined to have occurred. Accordingly, erroneous determinations due to noise can be avoided, and the reliability of confirming an abnormality is therefore increased. Furthermore, in a case in which an abnormality between the terminals of the electrolytic capacitor 83 has been confirmed, the retrial control is not performed. Accordingly, there is no unneeded repetition of retrials, wasted current to the current-limiting resistor 85 is suppressed, and the impact of heat on peripheral equipment from a temperature increase of the current-limiting resistor 85 is alleviated.

(3)

The control apparatus 4 is further provided with a remote control unit 4a, and when an abnormality between the terminals of the electrolytic capacitor 83 has been confirmed, an abnormality warning is displayed. A retrial control is not performed until the abnormality warning is terminated by way of the remote control unit 4a. Accordingly, until a cause for the abnormality between the terminals of the electrolytic capacitor 83 is resolved, the air conditioner will not be operated, and product safety is therefore enhanced.

MODIFIED EXAMPLES

The present invention has been heretofore described, but the concrete configuration is not limited to the embodiment described above, and modifications are possible without departing from the scope of the present invention.

For example, in the embodiment described above, the invention is applied to a converter circuit using a three-phase AC power source, but the invention may also be applied to a converter circuit for a single-phase AC power source.

Also, the control microcomputer 5 and the INV control microcomputer 6 are separately used in the above embodiment, but the control microcomputer 5 and the INV control microcomputer 6 may be combined into a single shared control microcomputer.

Also, in the present embodiment, a reactance 82 is disposed inside the smoothing circuit 8b of the converter 8, but the reactance may be dispensed with.

In the embodiment described above, the devices connected to the converter 8 are an inverter 9 and a compressor 11, but other devices may also be connected.

INDUSTRIAL APPLICABILITY

Thus, according to the present invention, a short circuit or other abnormality can be detected at an early stage between the terminals of an electrolytic capacitor inside a converter, and the present invention can therefore be used in control apparatuses.

What is claimed is:

1. A control apparatus comprising:
    a converter converting output of an AC power source to a DC current;
    a current-limiting circuit having a relay and a current-limiting resistor, the relay and the current-limiting resistor being disposed in front of a rectification circuit inside the converter;
    voltage detection detector detecting voltage between terminals of an electrolytic capacitor disposed in a smoothing circuit inside the converter; and microcomputers being configured to control on-off switching of the relay on the basis of the voltage between the terminals of the electrolytic capacitor that is detected by the voltage detector, the microcomputers switching on the relay in a time period that lasts until a prescribed charging time elapses, and gradually charge the electrolytic capacitor (83) via the current-limiting resistor, and the microcomputers switching on the relay and thereafter performing a first voltage detection control to detect the voltage between the terminals of the electrolytic capacitor when a first time period, which is shorter than the charging time, has elapsed.

2. The control apparatus as recited in claim 1, wherein the relay is switched off without waiting for the charging time to elapse when the voltage between the terminals of the electrolytic capacitor detected by the first voltage detection control does not reach a prescribed reference value.

3. The control apparatus as recited in claim 2, wherein an abnormality is determined and a retrial control is performed to perform the first voltage detection control again when the voltage between the terminals of the electrolytic capacitor detected by the first voltage detection control does not reach a prescribed reference value.

4. The control apparatus as recited in claim 3, wherein
the number of times an abnormality has been determined is counted when the voltage between the terminals of the electrolytic capacitor has been determined to be abnormal in the first voltage detection control, and
a failure that causes an abnormality in the voltage between the terminals of the electrolytic capacitor is determined to have occurred when a prescribed numerical value has been reached.

5. The control apparatus as recited in claim 4, wherein the retrial control is not performed when a failure that causes the abnormality of the voltage between the terminals of the electrolytic capacitor is determined to have occurred.

6. The control apparatus as recited in claim 4,
further comprises comprising a remote control unit, and wherein
an abnormality warning is displayed when a failure that causes the abnormality of the voltage between the terminals of the electrolytic capacitor is determined to have occurred, and the retrial control is not performed until operated by the remote control unit 4*a*.

7. The control apparatus as recited in claim 1, wherein, in a case in which the voltage between the terminals of the electrolytic capacitor detected by the first voltage detection control reaches a prescribed reference value, a second voltage detection control to detect the voltage between the terminals of the electrolytic capacitor is performed when the charging time has elapsed.

* * * * *